(12) United States Patent
Lan et al.

(10) Patent No.: US 12,739,998 B2
(45) Date of Patent: Sep. 15, 2026

(54) POWER MODULE

(71) Applicant: Delta Electronics (Shanghai) Co., Ltd., Shanghai (CN)

(72) Inventors: Lin Lan, Shanghai (CN); Quanliang Zhang, Shanghai (CN); Weiqiang Zhang, Shanghai (CN); Yicong Xie, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 342 days.

(21) Appl. No.: 18/346,878

(22) Filed: Jul. 5, 2023

(65) Prior Publication Data

US 2024/0215193 A1 Jun. 27, 2024

(30) Foreign Application Priority Data

Dec. 27, 2022 (CN) ......................... 202211714560.4

(51) Int. Cl.
*H05K 7/14* (2006.01)
*H01F 27/24* (2006.01)
*H02M 3/00* (2006.01)
*H05K 7/20* (2006.01)

(52) U.S. Cl.
CPC ........... *H05K 7/1432* (2013.01); *H01F 27/24* (2013.01); *H02M 3/003* (2021.05); *H05K 7/2089* (2013.01)

(58) Field of Classification Search
CPC ............... H05K 7/1432; H05K 7/2089; H05K 7/14325; H05K 7/20918; H05K 7/02; H01F 27/24; H01F 27/025; H01F 27/027; H01F 27/085; H01F 27/263; H01F 2027/329; H01F 27/28; H01F 27/324; H01F 3/14; H02M 3/003; H02M 1/007; H02M 1/0095;
(Continued)

(56) References Cited

U.S. PATENT DOCUMENTS 6,522,233 B1 * 2/2003 Kyoso .................. H01F 27/324 336/200
9,373,440 B2 * 6/2016 Chou .................... H01F 27/325
11,056,262 B2 * 7/2021 Itaya ................... H01F 27/2823
(Continued)

FOREIGN PATENT DOCUMENTS

CN 210778191 U 6/2020
CN 114465445 A 5/2022
(Continued)

*Primary Examiner* — Imani N Hayman
*Assistant Examiner* — Theron S Milliser
(74) *Attorney, Agent, or Firm* — CKC & Partners Co., LLC

(57) ABSTRACT

The present application discloses a power module, including: at least one transformer, each transformer including a primary side magnetic core and a secondary side magnetic core; a primary side power element, the primary side magnetic core and the primary side power element forming a primary side conversion unit; a secondary side power element, the secondary side magnetic core and the secondary side power element forming a secondary side conversion unit; and an insulating plate, disposed between the primary side conversion unit and the secondary side conversion unit, and including a first area, the first area being adaptively disposed between the primary side magnetic core and the secondary side magnetic core, and the first area having at least one buckling part and/or at least one bending part.

13 Claims, 7 Drawing Sheets

10

(58) Field of Classification Search
CPC .... H02M 3/01; H02M 3/33576; H02M 7/003; H02M 3/33569; H02M 7/487; H02M 1/00
See application file for complete search history.

(56) References Cited

U.S. PATENT DOCUMENTS

| | | | | |
|---|---|---|---|---|
| 11,477,920 | B2 * | 10/2022 | Lan | H05K 7/20172 |
| 11,842,836 | B2 * | 12/2023 | Suzuki | H01F 27/022 |
| 11,955,754 | B2 * | 4/2024 | Loder | H01R 13/187 |
| 12,094,640 | B2 * | 9/2024 | Yang | H01F 27/325 |
| 12,155,224 | B2 * | 11/2024 | Gradinger | H02M 3/003 |
| 2012/0257419 | A1 * | 10/2012 | Kaneko | H01F 27/306<br>336/198 |
| 2015/0248965 | A1 * | 9/2015 | Chou | H01F 27/325<br>336/208 |
| 2020/0258675 | A1 * | 8/2020 | Jimenez Pino | H01F 27/306 |
| 2020/0357558 | A1 * | 11/2020 | Suzuki | H01F 27/324 |
| 2021/0136960 | A1 * | 5/2021 | Lan | H01F 27/025 |
| 2021/0273382 | A1 * | 9/2021 | Loder | H01B 9/027 |
| 2022/0076877 | A1 * | 3/2022 | Yang | H01F 27/2823 |
| 2023/0051317 | A1 * | 2/2023 | Gradinger | H02M 3/285 |

FOREIGN PATENT DOCUMENTS

| | | | |
|---|---|---|---|
| EP | 3817013 | A1 | 5/2021 |
| EP | 4009753 | A1 | 6/2022 |
| JP | 7026015 | B2 | 2/2022 |

* cited by examiner

Structural Sketch of Power Unit

20

30

40

POWER MODULE

CROSS-REFERENCE TO RELATED APPLICATIONS

This non-provisional application claims priority under 35 U.S.C. § 119(a) on Patent Application 202211714560.4 filed in P.R. China on Dec. 27, 2022, the entire contents of which are hereby incorporated by reference.

Some references, if any, which may include patents, patent applications and various publications, may be cited and discussed in the description of this application. The citation and/or discussion of such references, if any, is provided merely to clarify the description of the present application and is not an admission that any such reference is "prior art" to the application described herein. All references listed, cited and/or discussed in this specification are incorporated herein by reference in their entireties and to the same extent as if each reference was individually incorporated by reference.

BACKGROUND OF THE APPLICATION

1. Field of the Application

The present application relates to the technical field of power electronics, in particular to a power module.

2. Related Art

With the trend of diversified consumption and the increase of national environmental protection constraints, the demand for electric vehicles has gradually increased, and the production and sales volume has continued to increase, which has a trend of surpassing the traditional vehicles. The demand for important supporting charging facilities, has also increased rapidly, and meanwhile the market's demands for their performances have been continuously improved.

As the country has incorporated the data center into the new infrastructure category, the accelerated construction of the big data center as the underlying infrastructure of the smart economy has become an inevitable demand, and the demand for supporting power supply equipment in the data center is also facing explosive growth. However, the power module, as the core component of the supporting power supply equipment for electric vehicles and data centers, also faces greater challenges and higher requirements.

The current power module is designed as shown in FIG. 1. The power module includes a front-stage conversion unit (HV), a post-stage conversion unit (LV) and a transformer. The front-stage conversion unit includes a first active element unit and a first passive element unit; the post-stage conversion unit (LV) includes a second active element unit and a second passive element unit; the transformer includes a primary side unit and a secondary side unit; wherein, the primary side unit is connected with the front-stage conversion unit, and the secondary side unit is connected with the post-stage conversion unit; the first active element unit and the primary side unit are provided on the first heat dissipation unit; the second active element unit and the secondary side unit are provided on the second heat dissipation unit; a straight horizontal insulating plate is used between the front-stage conversion unit, the primary side unit and the post-stage conversion unit, the secondary side unit. However, the power module as shown in FIG. 1 has the following disadvantages:

(1) High installation accuracy of the transformer: the straight horizontal insulating plate serves as both the insulation and the air gap of the transformer. The primary side unit and secondary side unit of the transformer are buckled with each other. The buckle surface is a straight plane, and the buckle area (i.e. the air gap size) is small. The requirements for the buckle accuracy (i.e. the air gap tolerance) of the primary side unit and secondary side unit of the transformer are high (±0.15 mm), which is difficult to achieve.

(2) Large deformation of the straight horizontal insulating plate: the straight horizontal insulating plate is a horizontal flat plate, which is easy to deform. It needs to increase plate thickness to ensure the required tolerance, resulting in large housing weight, thick insulating plate, complex manufacturing process and high cost.

Therefore, there is an urgent need for a power module to solve the above technical problems.

SUMMARY OF THE APPLICATION

The purpose of the present application is to provide a power module, which can solve one or multiple defects of the prior art.

In order to achieve the above purpose, the present application provides a power module, including at least one transformer, each transformer including a primary side magnetic core and a secondary side magnetic core; a primary side power element, the primary side magnetic core and the primary side power element forming a primary side conversion unit; a secondary side power element, the secondary side magnetic core and the secondary side power element forming a secondary side conversion unit; and an insulating plate, disposed between the primary side conversion unit and the secondary side conversion unit, and including a first area, the first area being adaptively disposed between the primary side magnetic core and the secondary side magnetic core, and the first area having at least one buckling part and/or at least one bending part.

The power module provided by the present application can effectively improve the power density of the power unit and simplify the assembly and manufacturing process by adopting the innovative structural layout scheme, so as to better meet the market demand and improve product competitiveness.

The above description will be explained with the implementation in detail, and the technical solution of the present application will be further explained.

BRIEF DESCRIPTION OF THE DRAWINGS

In order to more clearly illustrate the technical solution in the embodiment of the present application, a brief introduction of the accompanying drawings that are required in the embodiments is given below.

Figure 1:
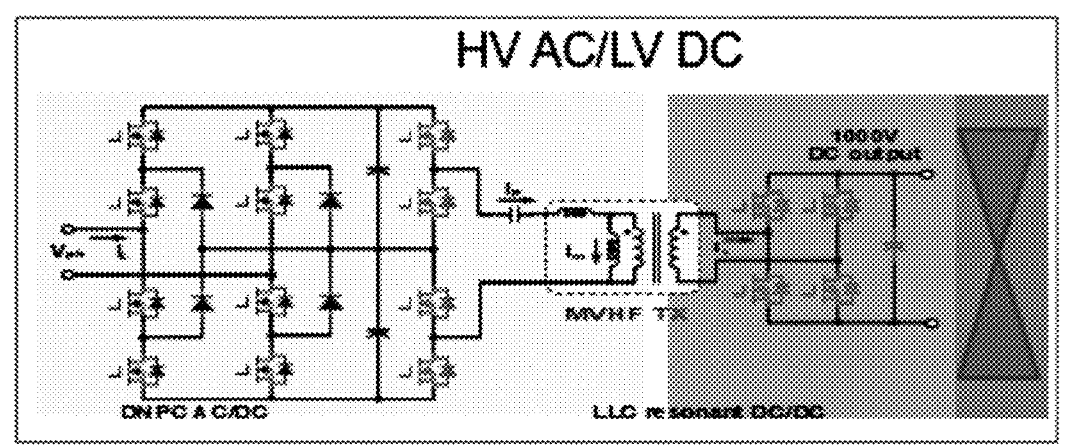
FIG. 1 is a structural diagram of the power module in the prior art.
Figure 1:
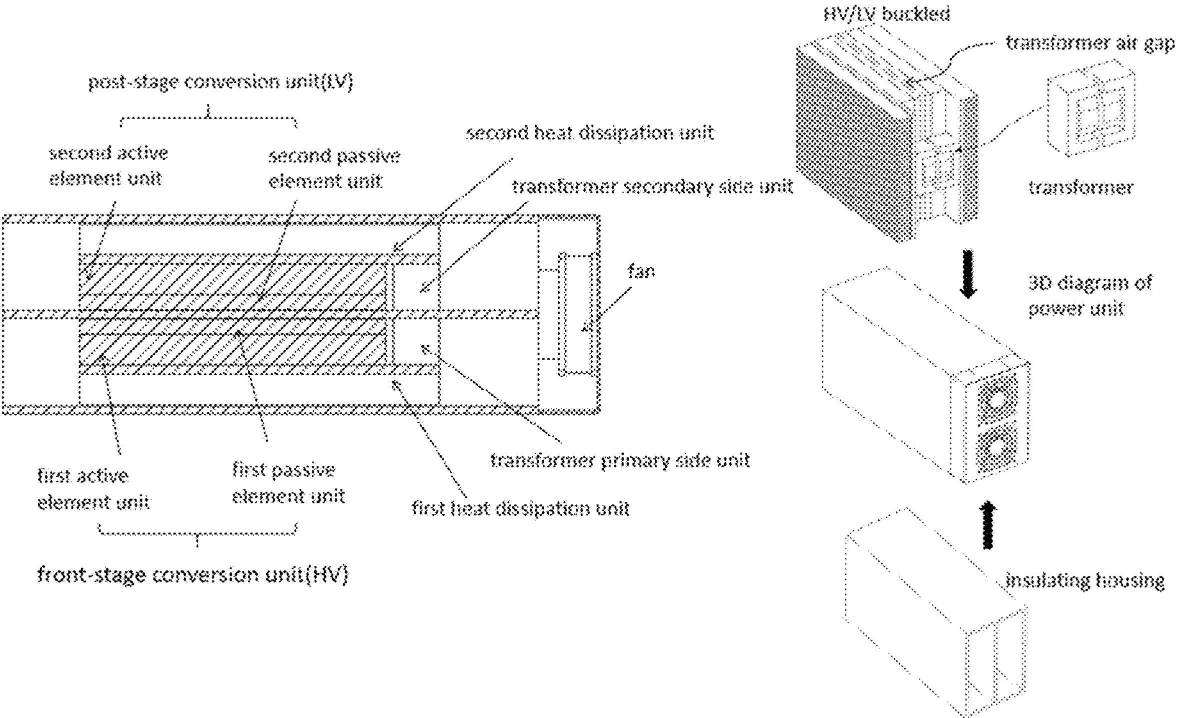

Additional aspects and advantages of the present application will be set forth in part in the following description, and will become apparent in part from the description, or may be learned through the practice of the present application.

DETAILED EMBODIMENTS OF THE APPLICATION

Exemplary embodiments will now be described more fully with reference to the accompanying drawing. However, the exemplary embodiments may be implemented in many forms and should not be construed as limited to the embodiments set forth herein. On the contrary, these exemplary embodiments are provided so that the present application will be comprehensive and complete, and will the conception of exemplary embodiments will be fully conveyed to those skilled in the art. The same reference numerals in the drawings denote the same or similar structures, and thus detailed descriptions thereof will be omitted.

When introducing the elements/components/etc. described and/or illustrated herein, the terms "one", "a", "this", "the" and "at least one" are used to indicate the existence of one or more elements/components/etc. The terms "include", "comprise" and "provided with" are used to mean open inclusion and mean that there may be other elements/components/etc. in addition to the listed elements/components/etc. In addition, the terms "first", "second" and the like in the claims are only used as marks, and are not numerical restrictions on their objects.

Figure 2A:
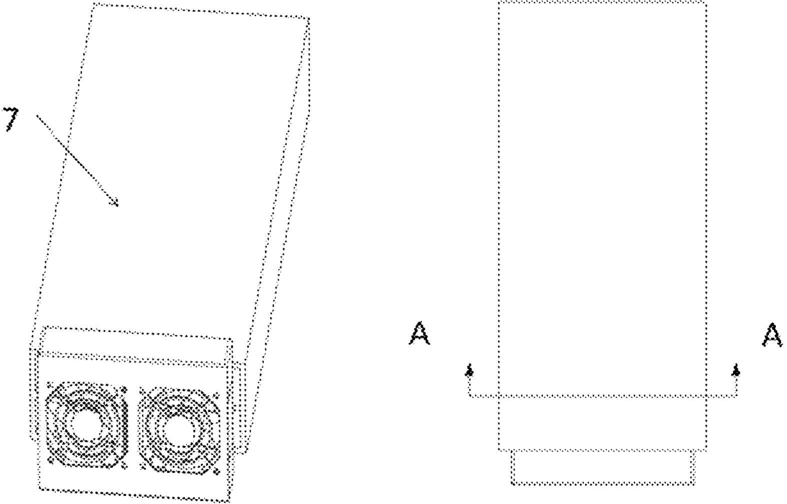
FIG. 2A is a 3D diagram of the power module of the present application.
Figure 2B:
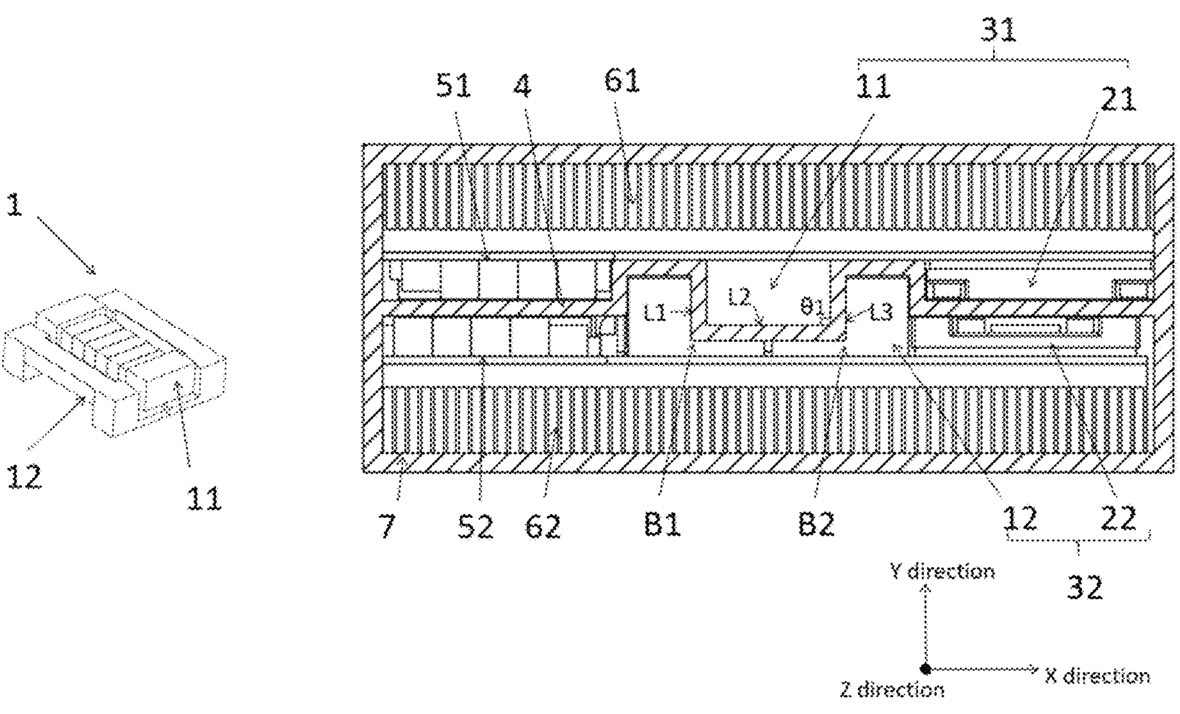
FIG. 2B is a sectional view of the power module as shown in FIG. 2A along the straight line A-A.

FIG. 2A shows a 3D diagram of the power module 10 in an embodiment of the present application. FIG. 2B is a sectional view of the power module 10 as shown in FIG. 2A along the straight line A-A. As shown in FIG. 2B, the power module 10 includes a transformer 1, a primary side power element 21, a secondary side power element 22, an insulating plate 4 and an insulating housing 7, wherein the transformer 1, the primary side power element 21, the secondary side power element 22 and insulating plate 4 are provided in the insulating housing 7. The transformer 1 is provided in the middle of the power module 10 along a first direction (for example, X direction), and includes a primary side magnetic core 11 and a secondary side magnetic core 12 buckled with each other. The primary side magnetic core 11 and the primary side power element 21 form a primary side conversion unit 31, and the secondary side magnetic core 12 and the secondary side power element 22 form a secondary side conversion unit 32. The insulating plate 4 is disposed between the primary side conversion unit 31 and the secondary side conversion unit 32, wherein the insulating plate 4 includes a first area, and the first area is adaptively disposed between the primary side magnetic core 11 and the secondary side magnetic core 12. Specifically, in the present embodiment, the primary side magnetic core 11 and the secondary side magnetic core 12 are buckled with each other, the secondary side magnetic core 12 is U-shaped, and the primary side magnetic core 11 is I-shaped. Therefore, a buckle surface between the primary side magnetic core 11 and the secondary side magnetic core 12 is a curved plane. The first area is provided according to the shape of the buckle surface. As shown in FIG. 2B, the first area includes a first side L1, a second side L2 and a third side L3. The first area has a plurality of buckling parts. The buckling part refers to the position where the insulating plate 4 buckles. In the present embodiment, the first area includes two buckling parts, namely a first buckling part B1 and a second buckling part B2. The first buckling part B1 is a buckling angle formed by the first side L1 and the second side L2, and the second buckling part B2 is a buckling angle formed by the second side L2 and the third side L3, wherein, the first buckling part B1 and the second buckling part B2 buckles from the primary side magnetic core 11 to the secondary side magnetic core 12. In other embodiments, the first buckling part B1 and the second buckling part B2 can also buckle from the secondary side magnetic core 12 to the primary side magnetic core 11, which is not limited by the present application. In the present embodiment, each buckling part has a buckling angle θ1. Take the second buckling part B2 as an example, the second side L2, the third side L3 and the point P constitute the buckling angle of the second buckling part B2, and its buckling angle θ1 meets the following conditions: $0<\theta 1<180°$, specifically, θ1 equals 90°.

Figure 3:
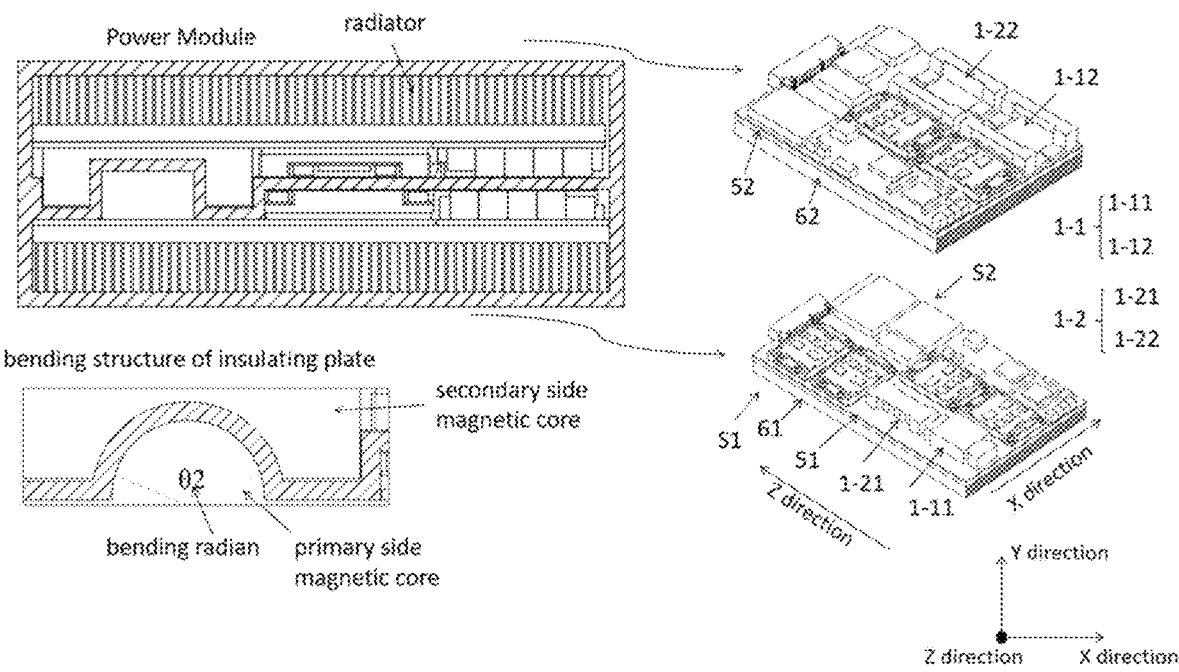
FIG. 3 is a sectional view of the power module of an embodiment of the present application.

In some embodiments, the secondary side magnetic core 12 can be arc-shaped, so that the first area includes at least one bending part, which can bend from the secondary side magnetic core 12 to the primary side magnetic core 11 or from the primary side magnetic core 11 to the secondary side magnetic core 12. As shown in FIG. 3, the bending part bends from the primary side magnetic core 11 to the secondary side magnetic core 12, and the bending part has a bending radian θ2, and θ2 meets the following conditions: $0<\theta 2<360°$; in some embodiments, θ2 meets the following conditions: $0<\theta 2<180°$. In addition, the secondary side magnetic core 12 or the primary side magnetic core 11 can also be other feasible non-closed structures, and the first area includes the buckling part and/or bending part corresponding to the shape of the buckle surface of the primary side magnetic core 21 and the secondary side magnetic core 22.

Figure 6:
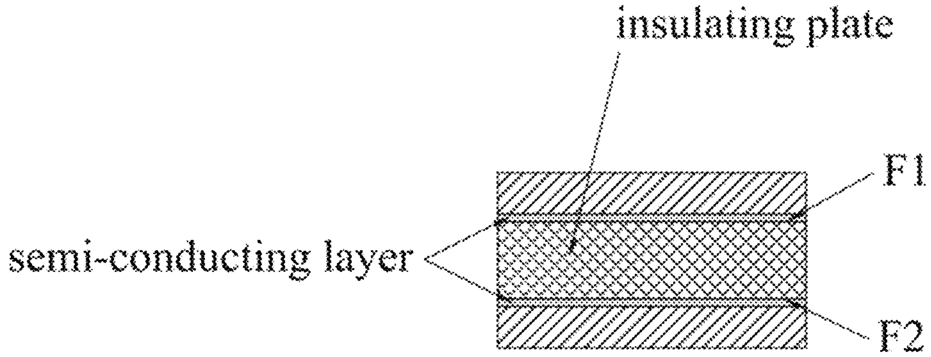
FIG. 6 is a structural diagram of the insulating plate of the present application.

In the present embodiment, as shown in FIG. 6, the insulating plate 4 includes a first surface F1 and a second surface F2 provided opposite each other, and the first surface and the second surface are respectively provided with a semi-conducting layer. The semi-conducting layer is made of, for example, graphene, or carbon black, etc.

Please continue to refer to FIG. 2B. In the present embodiment, the primary side conversion unit 31 is a HV side of the power module 10, and the HV side voltage is generally 10~35 KV; the secondary side conversion unit 32 is a LV side of the power module 10, and the LV side voltage is generally 240~1000V. The power module 10 further includes a primary side PCB 51, a secondary side PCB 52, a primary side heat dissipation unit 61 and a secondary side heat dissipation unit 62. The primary side conversion unit 31 is provided on the primary side PCB 51, and the secondary side conversion unit 32 is provided on the secondary side PCB 52, so that the electrical connection line between the conversion unit and the PCB is shorter. The primary side PCB 51 is provided on the primary side heat dissipation unit 61, and the secondary side PCB 52 is provided on the secondary side heat dissipation unit 62. The centralized heat dissipation of the transformer and the power device is realized. The cooling air entering the power module 10 can only pass through the primary side heat dissipation unit 61 and the secondary side heat dissipation unit 62, thus improving the reliability of the power module. In other embodiments, the primary side conversion unit 31 and the primary side heat dissipation unit 61 can be placed side by side, and the secondary side conversion unit 32 and the secondary side heat dissipation unit 62 can be placed side by side.

In the power module 10, the insulating plate 4 serves as both the insulation and the air gap of the transformer 1. The buckle surface of the primary side magnetic core 11 and the secondary side magnetic core 12 is a curved plane. The buckle area (i.e. the air gap size) is large, so the demand for the magnetic core installation accuracy (i.e. the air gap tolerance) is low (±0.5 mm). In addition, the insulating plate 4 is strengthened by buckling, which is not easy to deform. The thinner insulating plate can guarantee the tolerance, reduce the weight, and the deformation of the insulating plate is small. It also makes the subsequent shaping and correction process of the insulating plate simple and low cost.

FIG. 3 is a sectional view of the power module 20 of an embodiment of the present application. The power module 20 is provided with two transformers 1-1 and 1-2. Compared with the power module 10 as shown in FIG. 2B, the transformers 1-1 and 1-2 in the power module 20 are arranged in different modes. As shown in FIG. 3, the transformers 1-1 and 1-2 are arranged in a second direction (for example, Z direction), and then provided at the first side S1 of the power module 20. In other embodiments, the transformers 1-1 and 1-2 can be arranged in the second direction (for example, Z direction), and then provided at the second side S2 of power module 20, or in the middle of the power module 20 in the first direction (for example, X direction). In some embodiments, the transformers 1-1 and 1-2 can also be arranged in the first direction (for example, X direction), and provided at the first side S1, the second side S2 of the power module 20 or the middle of the power module 20 in the first direction. The first direction (X direction), the second direction (Z direction) and the third direction (Y direction) are perpendicular to each other. In addition, the transformers 1-1 and 1-2 can also be provided at the first side S1 and the second side S2 of the power module respectively. Power elements are provided around the transformers 1-1 and 1-2. The primary side magnetic core 1-11 of the transformer 1-1, the primary side magnetic core 1-21 of the transformer 1-2 and a part of the power elements are fixed on the primary side PCB 51, and the primary side PCB 51 is tightly fixed on the primary side heat dissipation unit 61; the secondary side magnetic core 1-12 of the transformer 1-1, the secondary side magnetic core 1-22 of the transformer 1-2 and another part of the power elements are fixed on the secondary side PCB 52, and the secondary side PCB 52 is tightly fixed on the secondary side cooling unit 62. In other embodiments, when the number of transformers is single or more than two, the provision is similar to that of transformers 1-1 and 1-2, and will not be repeated here.

By arranging one or more transformers at the side of the power module, the power elements in the primary side conversion unit and the secondary side conversion unit are concentrated together. For example, the power elements are concentrated in the middle of the power module along the first direction (X direction), or are concentrated at the first side S1 or the second side S2. The connecting lines between the power elements do not need to cross the transformer, and the connecting lines are shorter. It is convenient for power circuit alignment connection, saves connection space, and reduces PCB size.

Figure 4:
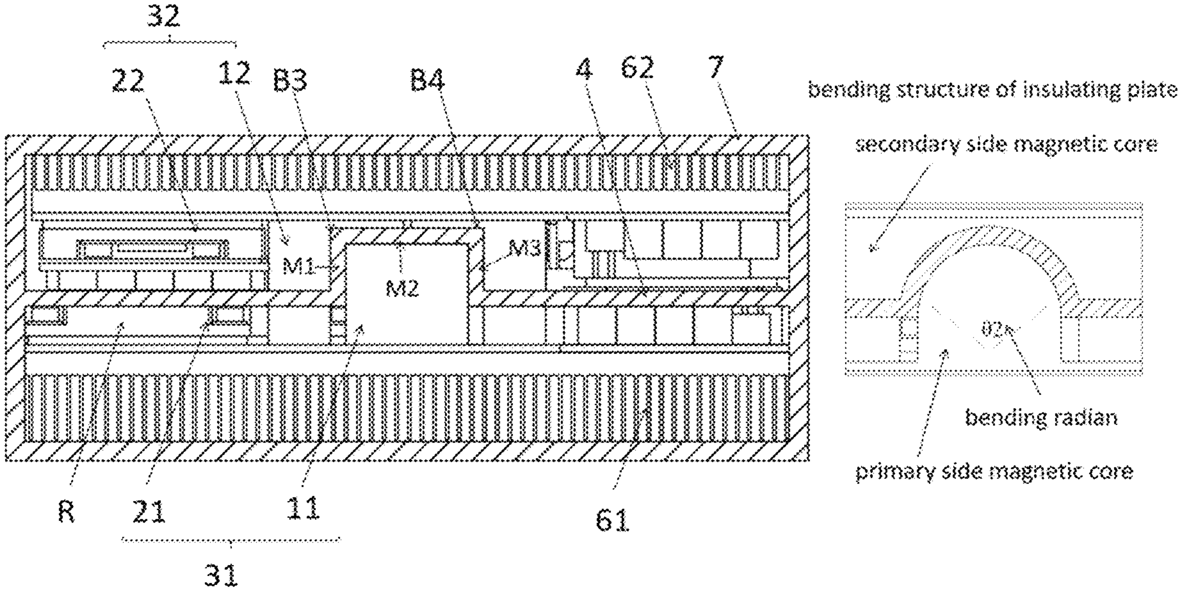
FIG. 4 is a sectional view of the power module of another embodiment of the present application.

FIG. 4 is a sectional view of the power module 30 in another embodiment of the present application. In the present embodiment, due to the changes in the position, size and other factors of the primary side magnetic core 11 and the secondary side magnetic core 12, the insulating plate 4 between the primary side conversion unit 31 and the secondary side conversion unit 32 has a different shape from the insulating plate 4 as shown in FIG. 2B. Like the insulating plate 4 as shown in FIG. 2B, the insulating plate 4 in the present embodiment also includes a first area, which is adaptively disposed between the primary side magnetic core 11 and the secondary side magnetic core 12, including a first side M1, a second side M2 and a third side M3. The first area includes two buckling parts, namely a third buckling part B3 (formed by a buckling angle formed by the first side M1 and the second side M2) and a fourth buckling part B4 (formed by a buckling angle formed by the second side M2 and the third side M3), wherein the third buckling part B3 and the fourth buckling part B4 both buckle from the primary side magnetic core 11 to the secondary side magnetic core 12. Furthermore, in other embodiments, the first area of the insulating plate 4 includes a bending part, which bends from the primary side magnetic core 11 to the secondary side magnetic core 12. In other embodiments, the bending part can bend from the secondary side magnetic core 12 to the primary side magnetic core 11. It can be understood that in these embodiments, the first area can also include a plurality of buckling parts and/or a plurality of bending parts. The plurality of buckling parts and/or the plurality of bending parts buckle or bend in the same direction, which can be from the secondary side magnetic core 12 to the primary side magnetic core 11, or from the primary side magnetic core 11 to the secondary side magnetic core 12.

As shown in FIG. 4, the third buckling part B3 and the fourth bending part B4 bend from the primary side magnetic core 11 to the secondary side magnetic core 12, namely, the insulating plate 4 includes a one-way bulge from the primary side magnetic core 11 to the secondary side magnetic core 12, and the optional height range of power element on the bulge side R of the insulating plate 4 is wide, which is easier to match. The insulating plate 4 has simple shape and is easy to process and manufacture.

Figure 5:
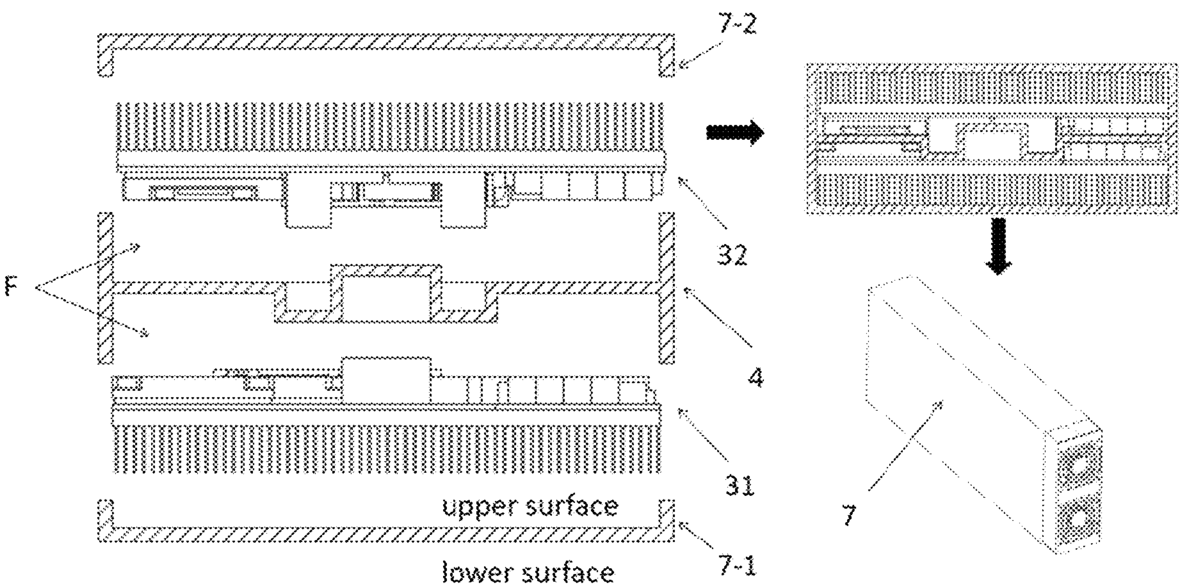
FIG. 5 is a sectional view of the power module of another embodiment of the present application.

FIG. 5 is the sectional view of the power module 40 of another embodiment of the present application. The power module 40 includes a first housing 7-1, and the primary side conversion unit 31 is provided between the first housing 7-1 and the insulating plate 4. Similar to the insulating plate 4, the upper surface of the first housing 7-1 is provided with a semi-conducting layer or conducting layer, and the lower surface is also provided with a semi-conducting layer or conducting layer. The semi-conducting layer is made of graphene or carbon black, etc. The first housing 7-1 is made of insulating materials, such as epoxy resin or nylon, etc. The first housing 7-1 is fixedly connected with the insulating plate 4 by screws or buckles.

The power module 40 can only use the first housing 7-1, or further use a second housing 7-2. The secondary side conversion unit 32 is provided between the second housing 7-2 and the insulating plate 4. The second housing 7-2 is made of insulating materials or metal materials, and the insulating materials are, for example, epoxy resin or nylon, etc. In the present embodiment, the first housing 7-1 and the second housing 7-2 are U-shaped plates. The first housing 7-1, the second housing 7-2 and a part of the insulating plate 4 form a cavity F. The cavity F is used to accommodate the primary side conversion unit 31 and the secondary side conversion unit 32. The first housing 7-1 and the second housing 7-2 are connected with the insulating plate 4 by screws or buckles. In other embodiments, the first housing 7-1 and the second housing 7-2 can also be flat plates. In the present embodiment, the first housing 7-1, the second housing 7-2 and part of the insulating plate are molded by assembly into the insulating housing 7. In other embodiments, the insulating housing 7 can be integrally molded.

In the present embodiment, the primary side conversion unit and the secondary side conversion unit can be installed vertically through the open insulation housing structure, and the installation is simple and convenient. The provision of the semi-conducting layer on the insulating housing makes the whole electric field concentrated on the insulating housing, reducing the size of the primary conversion unit and the external LV room of the power module.

To sum up, the power module provided by the present application can effectively improve the power density of the power unit and simplify the assembly and manufacturing process by adopting the innovative structural layout scheme, so as to better meet the market demand and improve product competitiveness.

Exemplary embodiments of the present application have been specifically shown and described above. It should be understood that the present application is not limited to the disclosed embodiments. On the contrary, the present application is intended to cover various modifications and equivalent arrangements included in the spirit and scope of the appended claims.

What is claimed is:

1. A power module, comprising:

at least one transformer, each transformer comprising a primary side magnetic core and a secondary side magnetic core;

a primary side power element, the primary side magnetic core and the primary side power element forming a primary side conversion unit;

a secondary side power element, the secondary side magnetic core and the secondary side power element forming a secondary side conversion unit; and an insulating plate, disposed between the primary side conversion unit and the secondary side conversion unit, and comprising a first area, the first area being adaptively disposed between the primary side magnetic core and the secondary side magnetic core, and the first area having at least one buckling part and/or at least one bending part, a buckle surface between the primary side magnetic core and the secondary side magnetic core is a buckling surface and/or a bending surface, the first area is disposed corresponding to the shape of the buckle surface, and is at least partially in direct contact with the primary side magnetic core and the secondary side magnetic core.

2. The power module according to claim 1, wherein the insulating plate comprises a first surface and a second surface provided opposite to each other, and the first surface and the second surface are respectively provided with semi-conducting layers.

3. The power module according to claim 1, wherein, when the at least one transformer comprises a single transformer, the single transformer is provided in the middle, the first side or the second side of the power module along a first direction;

when the at least one transformer comprises a plurality of transformers, the plurality of transformers are simultaneously provided in the middle, the first side or the second side of the power module along the first direction, or respectively provided at the first side and the second side of the power module.

4. The power module according to claim 1, further comprising a primary side PCB, a secondary side PCB, a primary side heat dissipation unit and a secondary side heat dissipation unit, wherein the primary side conversion unit is provided on the primary side PCB, and the secondary side conversion unit is provided on the secondary side PCB; the primary side PCB is provided on the primary side heat dissipation unit, and the secondary side PCB is provided on the secondary side heat dissipation unit.

5. The power module according to claim 1, wherein, the bending angle of the at least one buckling part is $\theta 1$, which meets the following conditions: $0<\theta 1<180°$; or the buckling radian of the at least one bending part is $\theta 2$, which meets the following conditions: $0<\theta 2<360°$.

6. The power module according to claim 1, wherein, the at least one buckling part buckles from the secondary side magnetic core to the primary side magnetic core or from the primary side magnetic core to the secondary side magnetic core;

the at least one bending part bends from the secondary side magnetic core to the primary side magnetic core or from the primary side magnetic core to the secondary side magnetic core.

7. The power module according to claim 1, further comprising an insulating housing, wherein the insulating housing comprises a first housing, and the primary side conversion unit is provided between the first housing and the insulating plate.

8. The power module according to claim 7, wherein an upper surface of the first housing is provided with a semi-conducting layer or conducting layer, and a lower surface of the first housing is provided with a semi-conducting layer or conducting layer.

9. The power module according to claim 7, wherein the first housing is made of an insulating material.

10. The power module according to claim 7, wherein the insulating housing further comprises a second housing, and the secondary side conversion unit is provided between the second housing and the insulating plate.

11. The power module according to claim 10, wherein the second housing is made of an insulating material or metal material, the primary side conversion unit is a HV side of the power module, and the secondary side conversion unit is a LV side of the power module.

12. The power module according to claim 10, wherein the first housing, the second housing and part of the insulating plate form a cavity, and the cavity is used to accommodate the primary side conversion unit and the secondary side conversion unit.

13. The power module according to claim 10, wherein the insulating housing further comprises a part of the insulating plate, wherein the insulating housing is integrally molded; or, the insulating housing is molded by assembly, and the first housing, the second housing and the part of the insulating plate are connected to form the insulating housing by screws or buckles.

* * * * *